United States Patent
Song et al.

(10) Patent No.: US 7,696,831 B2
(45) Date of Patent: Apr. 13, 2010

(54) PHASE LOCKED LOOP AND METHOD FOR CONTROLLING THE SAME

(75) Inventors: Taek-Sang Song, Kyoungki-do (KR); Kyung-Hoon Kim, Kyoungki-do (KR); Dae-Han Kwon, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 42 days.

(21) Appl. No.: 12/079,443

(22) Filed: Mar. 26, 2008

(65) Prior Publication Data

US 2009/0160560 A1 Jun. 25, 2009

(30) Foreign Application Priority Data

Dec. 21, 2007 (KR) .................. 10-2007-0135146

(51) Int. Cl.
*H03L 7/085* (2006.01)
*H03L 7/089* (2006.01)

(52) U.S. Cl. .................. 331/17; 331/25; 327/156; 327/157

(58) Field of Classification Search .............. 331/1 A, 331/8, 14–18, 25, DIG. 2; 327/156–159; 332/127; 360/51; 375/376; 455/260

See application file for complete search history.

(56) References Cited

U.S. PATENT DOCUMENTS

| 6,624,674 B1 * | 9/2003 | Zhao ..................... 327/156 |
| 6,693,496 B1 | 2/2004 | Lebouleux |
| 6,873,214 B2 | 3/2005 | Harwood |
| 6,922,047 B2 | 7/2005 | Knoll et al. |
| 7,095,289 B2 | 8/2006 | Knoll et al. |

FOREIGN PATENT DOCUMENTS

JP 2004-235842 8/2004

* cited by examiner

*Primary Examiner*—David Mis
(74) *Attorney, Agent, or Firm*—Blakely, Sokoloff, Taylor & Zafman

(57) ABSTRACT

Phase locked loop and method for controlling the same includes a phase/frequency detector configured to detect a phase difference between an input clock and a feedback clock to generate an up signal or a down signal depending on the detected phase difference, a charge pump configured to variably control a bandwidth according to a bandwidth control signal input thereinto, the charge pump operating in response to the up signal or the down signal and a voltage controlled oscillator configured to change a frequency according to an output of the charge pump.

19 Claims, 4 Drawing Sheets

PLL BW= $f[\ I_{CP1},\ I_{CP2},\ I_{PBIAS},\ C_1, C_2, K_{VCO}\ ]$ ated and locked to an external clock that is input from an external device such as a memory controller. To transfer data stably between the semiconductor memory device and a memory controller, synchronization of the data signal with a reference clock is very important.

PHASE LOCKED LOOP AND METHOD FOR CONTROLLING THE SAME

CROSS-REFERENCE TO RELATED APPLICATIONS

The present invention claims priority of Korean patent application number 10-2007-0135146, filed on Dec. 21, 2007, which is incorporated by reference in its entirety.

BACKGROUND OF THE INVENTION

The present invention relates to a phase locked loop capable of controlling a bandwidth, and a method for controlling the same.

A phase locked loop (PLL) and a delay locked loop (DLL) are typical examples of a feedback system. The feedback system in a synchronous semiconductor memory device performs a data transfer with external devices, using an internal clock synchronized and locked to an external clock that is input from an external device such as a memory controller. To transfer data stably between the semiconductor memory device and a memory controller, synchronization of the data signal with a reference clock is very important.

The PLL feedback system includes a phase/frequency detector, a charge pump, a loop filter and a voltage controlled oscillator (VCO) to change frequency of a clock input to the PLL feedback system. The phase/frequency detector compares a phase of the input clock with a phase of a feedback clock to generate an up signal or a down signal depending on a phase difference between the clocks. The charge pump outputs a current corresponding to the up signal or the down signal. The loop filter smoothes the current to generate a voltage. The voltage controlled oscillator generates a clock of a frequency corresponding to the input voltage.

A typical PLL system having the above described configuration filters a high frequency jitter component of an applied reference clock (or an input clock) to reduce a jitter component in a clock to be output.

FIG. 1 is a graph illustrating a functional relation of a PLL output jitter to a reference clock jitter versus an input jitter frequency in an ideal PLL system. The ideal PLL system serves as a low pass filter for removing high frequency jitter components having a frequency above a PLL bandwidth among the jitter components of the input clock (reference clock) while maintaining low frequency jitter components as they are.

The low pass filter of the typical PLL system generally has a certain bandwidth. However, because of the characteristics of the PLL system including a feedback loop, a phase margin may not be secured sufficiently. In that case, a peaking phenomenon rather increasing the reference jitter components may occur, as shown in FIG. 2.

In addition, the jitter peaking phenomenon may also occur even when a power noise near the bandwidth of the PLL system is applied, as shown in FIG. 3. Therefore, when a low jitter characteristic is required by the PLL system, the PLL system should have a bandwidth out of a frequency region of a maximum power noise or of a high reference clock jitter.

FIG. 4 is a circuit diagram illustrating a charge pump for determining a bandwidth in a typical PLL system. Referring to FIG. 4, the charge pump includes a first switch and a second switch operating in response to up/down signals provided by a phase/frequency detector, and a capacitor C3 connected to an output node between the first and second switches. The first and second switches include a switch type transistor for outputting the up/down signals.

The charge pump having the above described configurations charges/discharges the capacitor by a constant current Icp in response to the constant up/down signals applied to the first and second switches, to determine a control voltage of a voltage controlling oscillator. In other words, the charge pump allows a constant current to flow to the capacitor C3 in response to the applied up or down signal. Therefore, the charge pump consists of only one current source, and the current source has only one bandwidth in the PLL system.

As described above, in order to reduce jitter components, the PLL system should have a bandwidth out of a frequency region of a maximum power noise or of a high reference clock jitter. However, in a general purpose PLL system used in a variety of systems, it is difficult to select an appropriate PLL bandwidth excluding all the frequency regions of a maximum power noise or of a high reference clock jitter because they are different in different systems.

SUMMARY OF THE INVENTION

Embodiments of the present invention are directed to providing a PLL capable of controlling a bandwidth.

Embodiments of the present invention are also directed to providing a PLL capable of controlling a bandwidth according to an input code to select different bandwidths for different systems to which the PLL is applied.

Embodiments of the present invention are also directed to providing a PLL capable of changing current according to an input code to control a bandwidth.

Embodiments of the present invention are also directed to providing a method for controlling a PLL capable of controlling a bandwidth according to an input code to select different bandwidths for different systems to which the PLL is applied.

In accordance with an aspect of the present invention, there is provided a phase/frequency detector configured to detect a phase difference between an input clock and a feedback clock to generate an up signal or a down signal depending on the detected phase difference, a charge pump configured to variably control a bandwidth according to a bandwidth control signal input thereinto, the charge pump operating in response to the up signal or the down signal and a voltage controlled oscillator configured to change a frequency according to an output of the charge pump.

DESCRIPTION OF SPECIFIC EMBODIMENTS

Hereinafter, a phase locked loop (PLL) and a method for controlling the PLL in accordance with the present invention will be described in detail with reference to the accompanying drawings.

Figure 1:
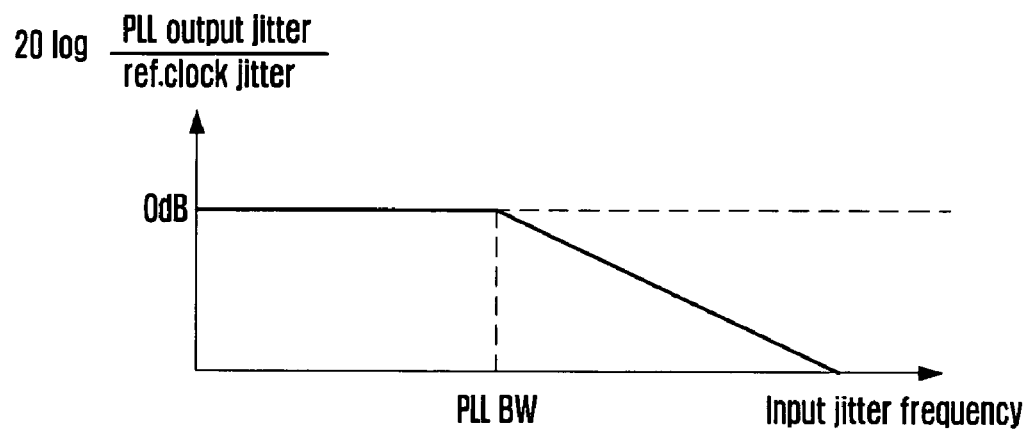
FIG. 1 is a graph illustrating a functional relation of a PLL output jitter to a reference clock jitter versus an input jitter frequency in an ideal PLL system.
Figure 2:
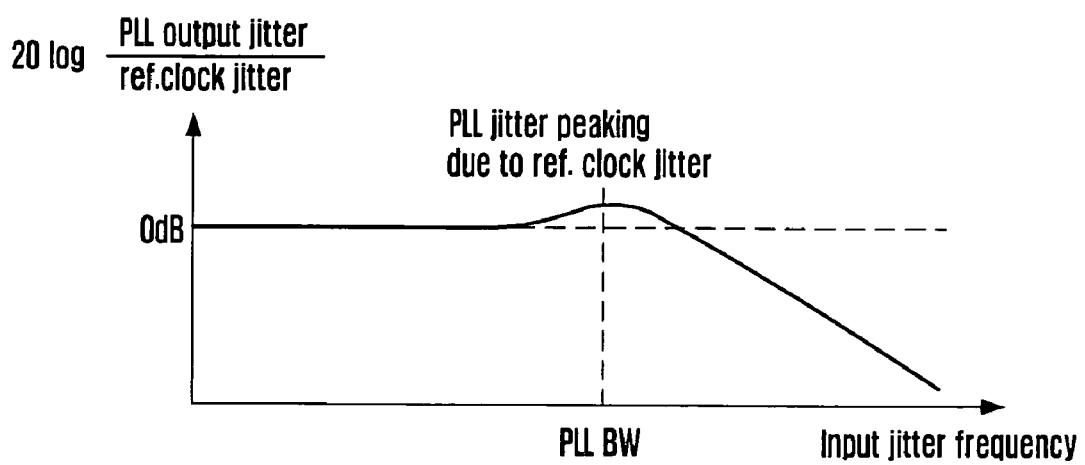
FIG. 2 is a graph illustrating a PLL jitter peaking phenomenon occurring near a bandwidth in a typical PLL system.
Figure 3:
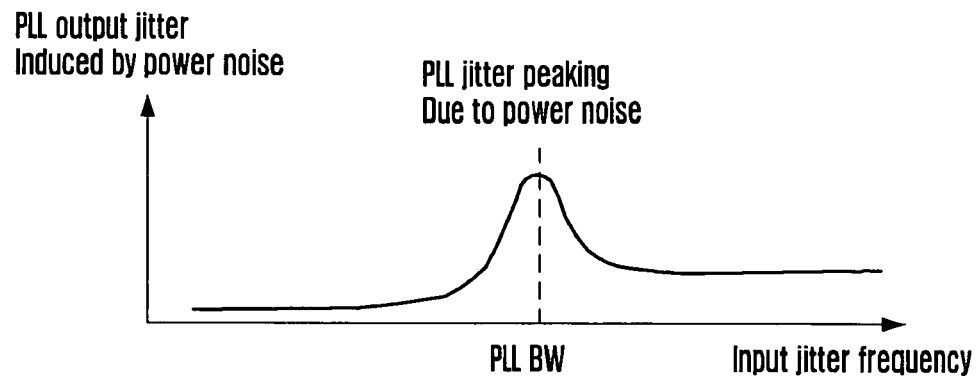
FIG. 3 is a graph illustrating a PLL jitter peaking phenomenon caused by a power noise in a typical PLL system.
Figure 4:
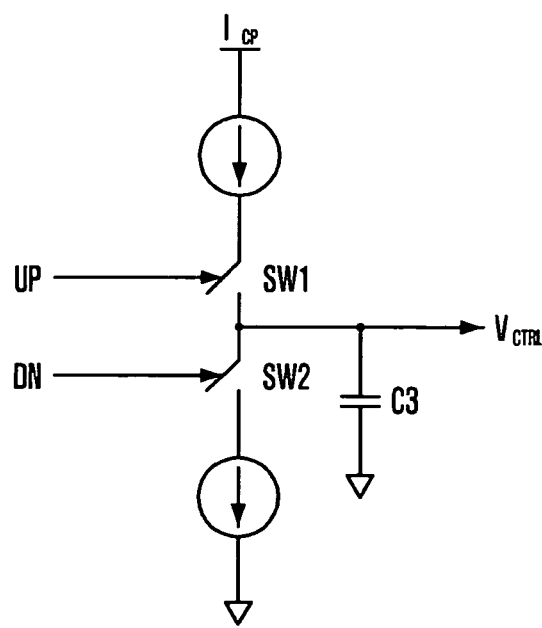
FIG. 4 is a circuit diagram of a typical charge pump.
Figure 5:
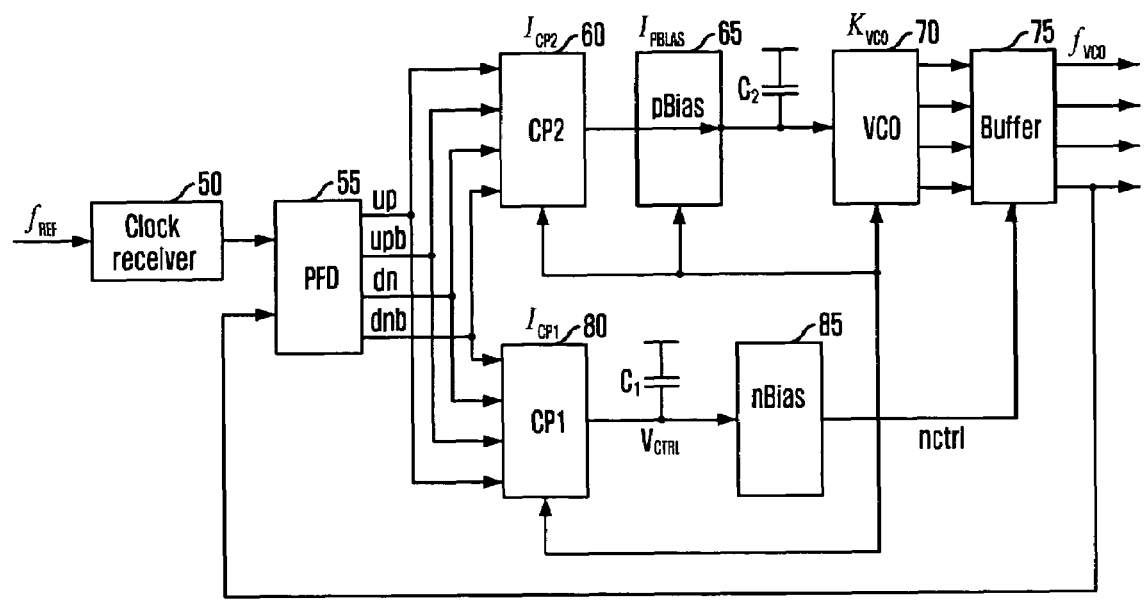
FIG. 5 is a block diagram of a PLL in accordance with an embodiment of the present invention.

FIG. 5 is a block diagram of a PLL in accordance with an embodiment of the present invention.

Referring to FIG. 5, the PLL has a configuration of a typical PLL system, including a phase/frequency detector (PFD) 55, a charge pump 60, and a voltage controlled oscillator (VCO) 70 to change frequency of an input clock. The phase/frequency detector 55 compares a phase of the input clock input thereinto with a phase of a feedback clock generated by a feedback loop to generate either an up signal or a down signal depending on a phase difference between the clocks. The charge pump generates a current corresponding to the up signal or the down signal. The voltage controlled oscillator generates a clock having a frequency corresponding to a voltage input from a P-bias generation circuit 61, a resistive element.

The feedback loop represents a current path passing through the phase/frequency detector, the charge pump, the P bias generation circuit, the voltage controlled oscillator and a buffer, and then going back to the phase/frequency detector. The P bias generation circuit 61 serves as a resistance between the charge pump 60 and the voltage controlled oscillator 70. The P-bias generation circuit 61 also generates a P bias control voltage required by the voltage controlled oscillator 70.

The PLL further includes a circuit for generating an N bias control voltage to be used in the PLL system, using the signals generated by the phase/frequency detector 55.

The circuit for generating the N bias control voltage includes a charge pump 80 and an N bias voltage generation circuit 85. The charge pump 80 generates a current corresponding to a clock input from the phase/frequency detector 55. The N bias voltage generation circuit 85 generates an N bias control voltage according to the current input from the charge pump 80. The N bias control voltage generated by the N bias voltage generation circuit 85 is used as a control voltage for operating an NMOS transistor in the PLL system. Therefore, the N bias control voltage is applied to the charge pumps 60 and 80, the P bias generation circuit 61, the voltage controlled oscillator 70 and the buffer 75.

The PLL may further include a clock receiver 50 and a buffer 75. The clock receiver 50 generates a clock having a frequency corresponding to a reference frequency. The buffer 75 buffers clocks generated by the voltage controlled oscillator 70 and the N bias generation circuit 85.

Figure 6:
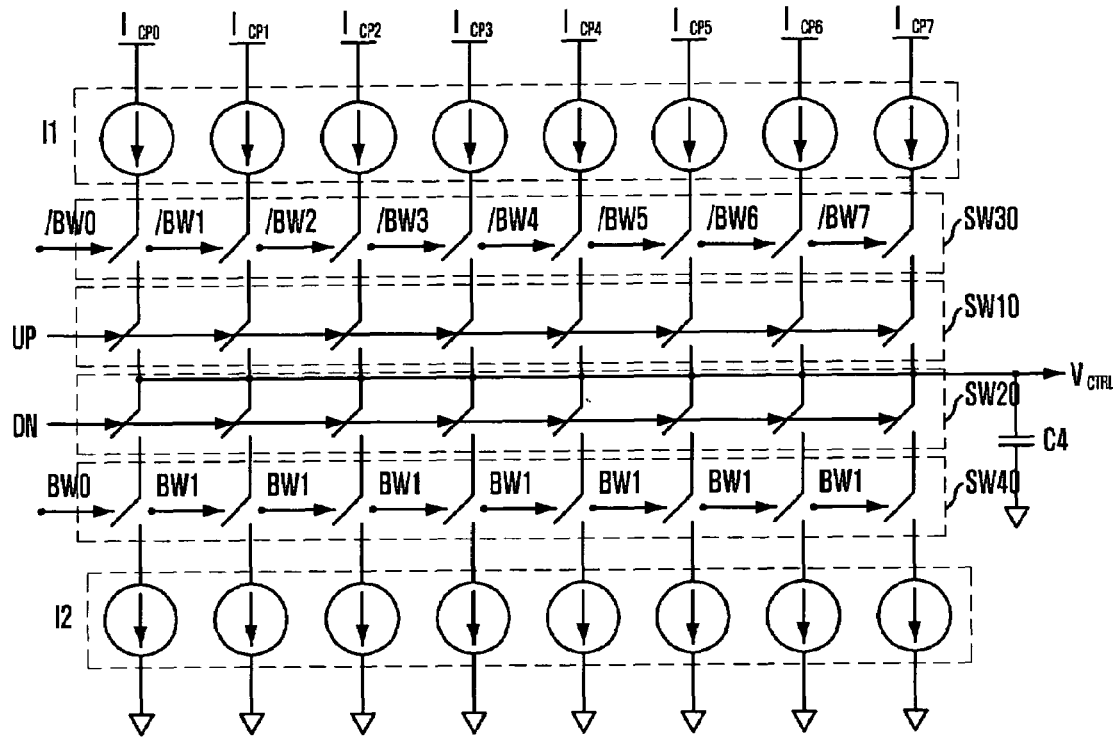
FIG. 6 is a circuit diagram of a charge pump in accordance with an embodiment of the present invention.

The charge pumps 60 and 80 control a bandwidth of the PLL system. FIG. 6 is a circuit diagram of the charge pumps 60 and 80 in accordance with an embodiment of the present invention. Referring to FIG. 6, the charge pumps 60 and 80 each includes a first current source group I1, a third switch group SW30, a first switch group SW10, an output node Vctrl, a second switch group SW20, a fourth switch group SW40, and a second current source group I2 which are sequentially connected in series between a power supply terminal and a ground terminal. Furthermore, to the output node, a capacitor C4 is connected. The third switch group SW30 selects one current source among a plurality of current sources of the current source group I1. The first switch group SW10 operates in response to an up signal applied from the phase/frequency detector 55. The second switch group SW20 operates in response to a down signal applied from the phase/frequency detector 55. The fourth switch group SW40 selects one current source among current sources of the second current source group I2, which will be described below.

The first current source I1 and the second current source I2 each includes a plurality of current sources having different current magnitudes, so that the charge pump can output a current having a variety of current magnitudes.

The first and second switch groups SW10 and SW20 operate in response to an up signal and a down signal applied from the phase/frequency detector, respectively, so that a current from the current source selected in response to the up signal or the down signal is applied to the output node. The first and second switches include a switch type transistor. The third switch group SW30 selects one current source among current sources of the first current source group I1, and the fourth switch group SW40 selects one current source among current sources of the second current source group I2. Operations of the third and fourth switch groups are controlled by a mode register set (MRS) (not shown). The MRS determines a PLL bandwidth appropriate to the system and then controls the third and fourth switch groups to supply a current corresponding to the determined PLL bandwidth, during the PLL operation. In the embodiment of FIG. 6, the third and fourth switch groups are controlled by the same control signal. However, the present invention is not limited thereto. For example, the third and fourth switch groups can also be controlled by different control signals. In other words, the control signals generated by the MRS using a predetermined program to control the third and fourth switch groups may have either the same value or different values.

In summary, each of the charge pumps 60 and 80 in accordance with the embodiment of the present invention includes a switch group of a plurality of switches to generate current of a magnitude determined by the operations of the switches. Therefore, the charge pump can control the bandwidth of the PLL system by changing the magnitude of the current. The current may be changed in a magnitude according to an input code.

Hereinafter, operations of a PLL in accordance with an embodiment of the present invention will be described.

An MRS provides a control signal according to a bandwidth change, to control a bandwidth of the PLL system. The control signal is a signal for controlling the bandwidth change using a predetermined program. The bandwidth control signal is applied to charge pumps 60 and 80 to control operations of a third switch group SW30 and a fourth switch group SW40. Output currents of the charge pumps 60 and 80 are determined by current sources operated by the switches selected from the third and fourth switch groups SW30 and SW40.

Figure 7:
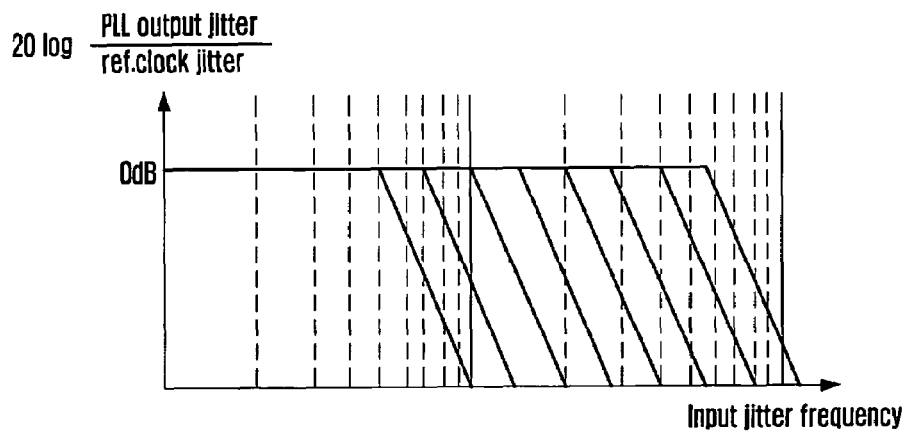
FIG. 7 is a graph illustrating variation of a bandwidth according to an input code in a PLL system in accordance with an embodiment of the present invention.

For example, when a switch /BW0 of the third switch group SW30 and a switch BW0 of the fourth switch group SW40 are closed, a current source connected to the switches /BW0 and BW0 operates. When a switch /BW1 of the third switch group SW30 and a switch BW1 of the fourth switch group SW40 are closed, a current source connected to the switches /BW1 and BW1 operates. Since the current source connected to the switches /BW0 and BW0 and the current source connected to the switches /BW1 and BW1 have different current magnitudes, the magnitude of the output current from the charge pump can be changed. Further, as the current of the charge pump changes, the bandwidth of the PLL system is also changed. FIG. 7 illustrates variation of a bandwidth according to a bandwidth control signal (input code) input into the charge pump in accordance with an embodiment of the present invention.

When an up signal or a down signal is input from a phase/frequency detector 55, the charge pump 60 supplies a current from the operating current source connected to the closed switches to the capacitor C4. Repeated charging and discharging operations of the capacitor C4 allows a constant control voltage to be applied to the voltage controlled oscillator 70. The voltage controlled oscillator 70 generates a clock of a frequency corresponding to the input control voltage, allowing the frequency to be changed according to a clock input into the PLL system. As such, the PLL system controls the current of the charge pump to select a bandwidth that is appropriate to the characteristics of the system.

The present invention may also be applied to a bandwidth control of a bias generation circuit which generates a bias control voltage according to a bandwidth control of the PLL system. That is, a charge pump 80 is also interlocked to the bandwidth control of the PLL system with the configuration of FIG. 6. As a bandwidth of the output current is changed, the bias control voltage generated by the N bias voltage generation circuit 85 is also changed.

A PLL in accordance with embodiments of the present invention optimizes a PLL bandwidth to each system to reduce a peaking near the bandwidth, a key factor that causes a jitter in a PLL system. For this end, the PLL controls a magnitude and a proportion of the current of a charge pump according to an input code to control the PLL bandwidth, so that the PLL has a sufficient phase margin to reduce the overall jitter peaking.

While the present invention has been described with respect to the specific embodiments, it will be apparent to those skilled in the art that various changes and modifications may be made without departing from the spirit and scope of the invention as defined in the following claims.

What is claimed is:

1. A phase locked loop comprising:
    a phase/frequency detector configured to detect a phase difference between an input clock and a feedback clock to generate an up signal or a down signal depending on the detected phase difference;
    a charge pump configured to variably control a bandwidth according to a bandwidth control signal input from a mode register set (MRS) thereinto, the charge pump operating in response to the up signal or the down signal; and
    a voltage controlled oscillator configured to change a frequency according to an output of the charge pump.

2. The phase locked loop as recited in claim 1, wherein the charge pump variably controls a current.

3. The phase locked loop as recited in claim 2, wherein the charge pump comprises:
    an up switch group including a plurality of up switches operating in response to the up signal;
    a down switch group including a plurality of down switches operating in response to the down signal;
    a current source group including a plurality of current sources connected between a power supply terminal and a ground terminal to generate respective currents of different magnitudes; and
    a control switch group including a plurality of control switches to select one of the plurality of current sources according to a bandwidth control signal input thereinto.

4. The phase locked loop as recited in claim 2, wherein the charge pump comprises:
    a first switch group including a plurality of first switches operating in response to the up signal;
    a second switch group including a plurality of second switches operating in response to the down signal;
    a first current source group including a plurality of first current sources connected between a power supply terminal and the first switch group;
    a third switch group including a plurality of third switches to select one of the plurality of first current sources;
    a second current source group including a plurality of second current sources connected between a ground terminal and the second switch group; and
    a fourth switch group including a plurality of fourth switches to select one of the plurality of second current sources.

5. The phase locked loop as recited in claim 4, wherein a bandwidth control signal for controlling the third switch group and a bandwidth control signal for controlling the fourth switch group are the same control signal predefined for controlling a bandwidth.

6. The phase locked loop as recited in claim 4, wherein a bandwidth control signal for controlling the third switch group and a bandwidth control signal for controlling the fourth switch group are different control signals predefined for controlling a bandwidth.

7. The phase locked loop as recited in claim 1, further comprising a P bias control voltage generation circuit that is a resistive device connected between the charge pump and the voltage controlled oscillator.

8. The phase locked loop as recited in claim 7, further comprising a buffer configured to store an output clock of the voltage controlled oscillator.

9. A phase locked loop comprising:
    a phase/frequency detector configured to detect a phase difference between an input clock and a feedback clock to generate an up signal or a down signal depending on the detected phase difference;
    a first charge pump configured to variably control a bandwidth according to a bandwidth control signal input from a mode register set (MRS) thereinto, the first charge pump operating in response to the up signal or the down signal;
    a voltage controlled oscillator configured to change a frequency according to an output of the charge pump; and
    a bias voltage generation circuit configured to variably control a current to generate a bias control voltage according to a bandwidth control signal input thereinto, the bias voltage generation circuit operating in response to the up signal or the down signal.

10. The phase locked loop as recited in claim 9, wherein the bias voltage generation circuit comprises:
    a second charge pump configured to variably control a bandwidth according to a bandwidth control signal input thereinto, the second charge pump operating in response to the up signal or the down signal; and
    a bias voltage generator configured to generate a bias control voltage corresponding to a control voltage generated by the second charge pump.

11. The phase locked loop as recited in claim 10, wherein the first and second charge pumps variably control a current.

12. The phase locked loop as recited in claim 11, wherein each of the first and second charge pumps comprises:
    an up switch group including a plurality of up switches operating in response to the up signal;
    a down switch group including a plurality of down switches operating in response to the down signal;
    a current source group including a plurality of current sources connected between a power supply terminal and a ground terminal to generate respective currents of different magnitudes; and
    a control switch group including a plurality of control switches to select one of the plurality of current sources according to a bandwidth control signal input thereinto.

13. The phase locked loop as recited in claim 11, wherein each of the first and second charge pumps comprises:
    a first switch group including a plurality of first switches operating in response to the up signal;
    a second switch group including a plurality of second switches operating in response to the down signal;

a first current source group including a plurality of first current sources connected between a power supply terminal and the first switch group;

a third switch group including a plurality of third switches to select one of the plurality of first current sources;

a second current source group including a plurality of second current sources connected between a ground terminal and the second switch group; and a fourth switch group including a plurality of fourth switches to select one of the plurality of second current sources.

14. The phase locked loop as recited in claim 13, wherein a bandwidth control signal for controlling the third switch group and a bandwidth control signal for controlling the fourth switch group are the same control signal predefined for controlling a bandwidth.

15. The phase locked loop as recited in claim 13, wherein a bandwidth control signal for controlling the third switch group and a bandwidth control signal for controlling the fourth switch group are different control signals predefined for controlling a bandwidth.

16. The phase locked loop as recited in claim 9, further comprising a P bias control voltage generation circuit that is a resistive device connected between the first charge pump and the voltage controlled oscillator.

17. The phase locked loop as recited in claim 16, further comprising a buffer configured to store an output clock of the voltage controlled oscillator.

18. A method for controlling a phase locked loop, the method comprising:

detecting a phase difference between an input clock and a feedback clock to generate an up signal or a down signal depending on the detected phase difference;

applying a bandwidth control signal;

receiving the up signal or the down signal to variably control a bandwidth according to the bandwidth control signal applied from a mode register set (MRS); and changing a frequency according to a control voltage that is generated depending on the changed bandwidth.

19. The method as recited in claim 18, further comprising:

receiving the up signal or the down signal to variably control a current according to the bandwidth control signal so that a bias control voltage is generated; and supplying the generated bias control signal as an NMOS transistor control voltage.

\* \* \* \* \*